US005808897A

United States Patent [19]
Miller, Jr. et al.

[11] Patent Number: 5,808,897
[45] Date of Patent: Sep. 15, 1998

[54] INTEGRATED CIRCUIT DEVICE HAVING INTERCHANGEABLE TERMINAL CONNECTION

[75] Inventors: James E. Miller, Jr.; Daryl L. Habersetzer, both of Boise, Id.

[73] Assignee: Micron Technology, Inc., Boise, Id.

[21] Appl. No.: 611,420

[22] Filed: Mar. 5, 1996

[51] Int. Cl.$^6$ .............................. G05B 19/05; H04Q 11/00
[52] U.S. Cl. ........................... 364/490; 364/491; 326/41; 257/203; 257/209
[58] Field of Search ..................................... 364/489, 490, 364/238, 238.1, 238.2, 238.3, 238.8, 488–491; 437/51; 439/52; 395/183.04; 326/32, 39–41; 361/624, 686; 340/825.84, 825.57; 371/22.3; 307/465; 257/203, 208–211

[56] References Cited

U.S. PATENT DOCUMENTS

| | | | |
|---|---|---|---|
| 4,431,928 | 2/1984 | Skokan | 307/465 |
| 5,231,588 | 7/1993 | Agrawal et al. | 364/489 |
| 5,621,650 | 4/1997 | Agrawal et al. | 364/489 |

OTHER PUBLICATIONS

Her et al. ("Over–the–cell routing with cell orientations", IEEE, 1994 IEEE International Symposium on Circuits and Systems, 30 May 1994, vol. 1, pp. 471–474).

Liang et al. ("High–performance VLSI through package–level interconnects", IEEE, 1989 Proceedings of 39th Electronic Components Conference, 22 May 1989, pp. 518–523).

*Primary Examiner*—Emanuel Todd Voeltz
*Assistant Examiner*—Phallaka Kik
*Attorney, Agent, or Firm*—Seed and Berry LLP

[57] ABSTRACT

An integrated circuit package allows coupling of an integrated device within the package to the signal terminals of the package according to more than one connection pattern. The connection pattern is realized by coupling multiplexers between the integrated device and the signal terminals such that the pattern of coupling between the integrated device and the signal terminals can be controlled by a control signal. The control signal can be produced external to the package or within the package. In response to a control signal of the first state, the signal terminals are connected to the integrated device in a first pattern. In response to the control signal in the second state, the signal terminals are connected to the integrated device in a second pattern, different from the first pattern. In one embodiment, the first pattern and second pattern are mirror images to allow the packages to be mounted to opposite sides of a module while minimizing routing difficulties.

19 Claims, 3 Drawing Sheets

INTEGRATED CIRCUIT DEVICE HAVING INTERCHANGEABLE TERMINAL CONNECTION

TECHNICAL FIELD

The present invention relates to integrated circuit devices, and more particularly, to integrated circuit devices having interchangeable signal terminals.

BACKGROUND OF THE INVENTION

Integrated circuit devices, such as integrated memory devices, are typically packaged in sealed packages sometimes having fixed signal terminals, such as input/output pins or pads (hereinafter collectively referred to as "I/O terminals"). The packages are often bonded, using, conventional assembly techniques, to a carrier such as a printed circuit board.

For electrical connection, the I/O terminals are mated to corresponding holes or pads on the carrier and soldered or otherwise coupled to the carrier. Conductors on the surface of the carrier carry signals to and from the integrated circuit device. Such conductors are typically formed through conventional photolithographic processing. The conductors extend from the integrated circuit device to other devices on the carrier or to a multiple pin connector. For example, common memory modules include a plurality of memory devices coupled to common address and data buses through multi-pin connectors or card-edge connectors.

Because such modules have several conductors and require several input and output signals, routing of conductors on the carrier can be quite complex. Moreover, because the conductors often carry transient signals, the conductors must be laid out with attention to possible intercoupling between adjacent or other nearby conductors.

To increase packing density of such integrated devices, modules are sometimes mounted on both sides of the carrier. A common connector then simultaneously provides signals such as data and addresses to the devices on both sides of the carrier.

Typically, such two-sided modules are formed in one of two types of structures. In the first type of structure, identical integrated devices are placed on opposite sides of the carrier. Common input and output signals then travel to the integrated devices via conductors on opposite sides of the carrier. However, because the integrated devices on the rear side of the carrier are "flipped" with respect to devices on the front side of the carrier, the signal terminals of the devices on the rear are reversed relative to those on the front. The conductor routing on opposite sides of the carrier must therefore be different and often requires undesired crossovers, i.e., locations where one of the conductors intersects another at an insulated crossover point. Such crossovers increase the complexity of the carrier and can produce reliability and signal cross-coupling problems. Consequently, routing the conductors from the common connector to devices on both the front and rear sides of the carrier can be undesirably complex and unreliable when identical devices are placed on opposite sides of the carrier.

In a second type of structure, integrated devices having different terminal structures are placed on opposite sides of the carrier. Typically, the terminal structure of devices on the rear of the carrier is the mirror image of those on the front. When the mirror image devices and "regular" devices are placed on opposite sides of the carrier, the corresponding terminals can be aligned and the conductor patterns on the front and rear of the carrier can be simple mirror images. Consequently, complementary routing of the conductors on the carrier is much simpler. However, this approach requires two different sets of integrated devices to be fabricated. Fabrication of different types of devices can be expensive. Moreover, the use of two different types of devices on a common carrier requires additional care in identifying the proper device types and in tracking inventories of two types of devices.

SUMMARY OF THE INVENTION

According to the present invention, an integrated circuit package includes internal control of coupling between an integrated circuit and the package's signal terminals. In a preferred embodiment of the invention, the integrated device is coupled to the signal terminals through sets of multiplexers. The multiplexers are controlled by a mode control input so that signals are coupled between the integrated device and signal terminals in one of two distinct patterns, where the second pattern is the mirror image of the first pattern.

One embodiment of a package according to the invention includes a plurality of signal terminals on a package body. An integrated circuit within the body has a plurality of signal lines coupled to the plurality of signal terminals through a switching circuit. The switching circuit has a plurality of signal inputs and a control input. Each signal input is coupled to either a signal terminal or a signal line. Each switching circuit also includes an output coupled to the other of the signal line or signal terminal. The switching circuit is responsive to the control input such that, in response to a control signal of a first state, the switching circuit couples the signal lines to the signal terminals in a first pattern, and in response to a control signal of a second state different from the first state, the switching circuit couples the signal lines to the signal terminals in a second pattern different from the first pattern. In the preferred embodiment, the second pattern is the mirror image of the first pattern.

In one embodiment, the control signal is produced externally and provided to the integrated package at a mode terminal. In another embodiment, the control signal is produced within the integrated package. In this embodiment, the control signal can be produced using fuses, anti-fuses, programmable read only memories, or any other mechanism for programming an option in the integrated device.

DETAILED DESCRIPTION OF THE INVENTION

Figure 1A:
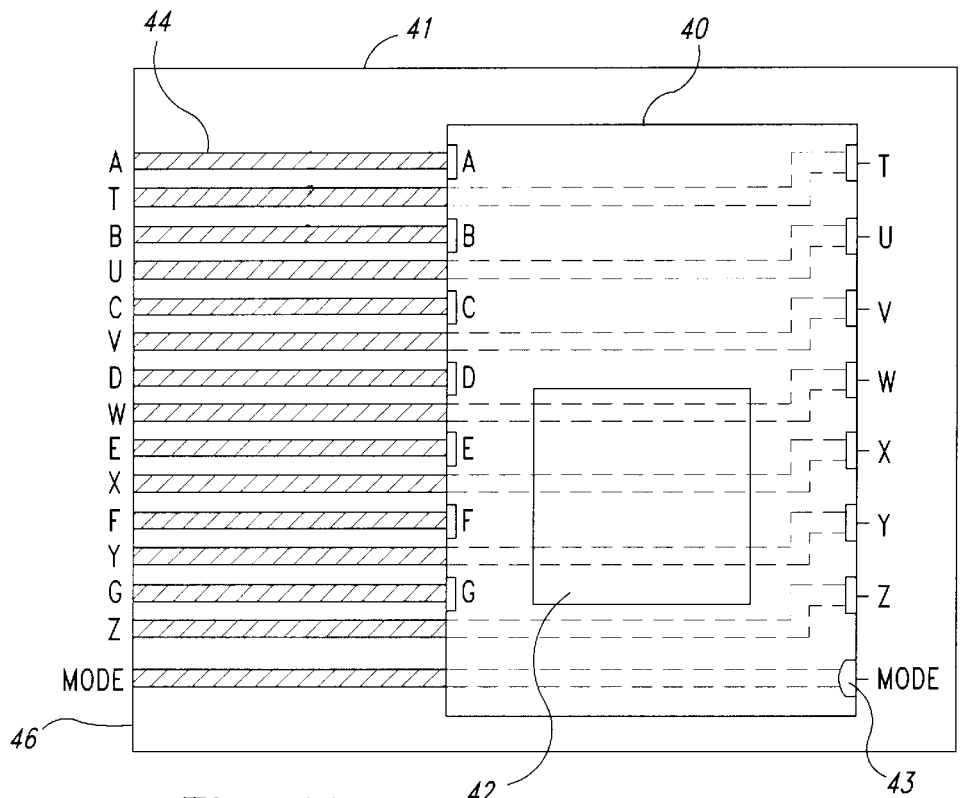
FIG. 1A is a plan view of an integrated circuit package on a carrier showing conductors and package terminals for a first terminal pattern.

As shown in FIG. 1A, a first integrated circuit package 40 according to the invention mounts to a planar, two sided carrier 41, such as a printed circuit board. The first package 40 contains an integrated circuit 42, which may be an integrated memory, or other conventional integrated device. The first package 40 also includes two sets of signal terminals A-G, T-Z on opposite sides of the first package 40. The signal terminals A-G, T-Z may be any type of conventional input or output terminal, such as a conductive pad or pin. In addition to the signal terminals A-G, T-Z, the first package 40 also includes a mode terminal 43 to which a mode control signal M is input.

The signal terminals A-G, T-Z provide input and output terminals for coupling signals to and from the integrated circuit 42. The signal terminals A-G, T-Z receive such signals from conductive traces 44 on the carrier 41 that extend to the left from the signal terminals A-G, T-Z to an edge connector 46 that allows edge connection to the carrier 41.

As represented by the broken lines, several of the traces 44 pass beneath the first package 40. Upon emerging from beneath the first package 40, the traces from the right side of the package 40 are interleaved with traces from the left side of the package 40. Consequently, at the edge connector 46 of the carrier 41, the pattern of connection alternates between signals from the signal terminals A-G and from the signal terminals T-Z. The mode signal M arrives on the lowermost trace 44 from the mode terminal 43.

Figure 1B:
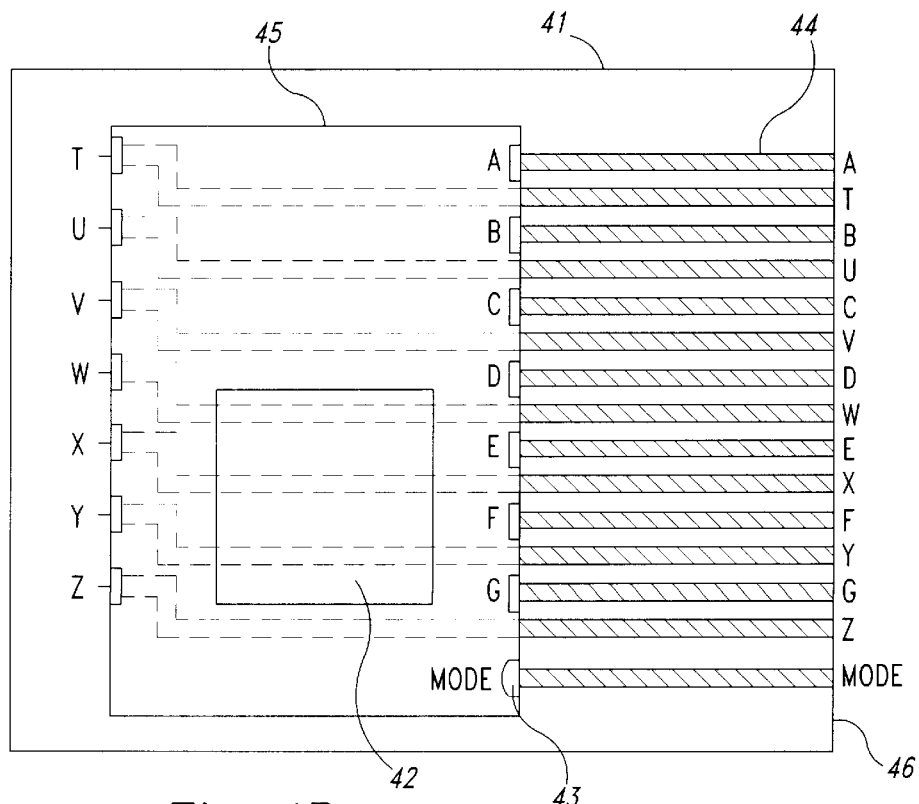
FIG. 1B is a plan view of an integrated circuit package on a carrier showing conductors and package terminals for a second terminal pattern that is a mirror image of the first terminal pattern.

FIG. 1B shows a second package 45 that includes signal terminals A-G, T-Z in a pattern that is a mirror image of the terminal pattern of the first package 40 of FIG. 1A though the location of the mode terminal 43 is not changed. The second package 45 is mounted to a carrier 41 having traces 44 that are the mirror image of the traces 44 of FIG. 1A. In the preferred embodiment of the invention, the carrier 41 of FIG. 1B is the same carrier 41 shown in FIG. 1A. However, the second package 45 and conductive traces 44 in FIG. 1B are on a rear face of the carrier 41 opposite the face carrying the first package 40 and traces 44 (FIG. 1A).

Because the second package's terminal pattern and the traces 44 of FIG. 1B are mirror images of the first package 40 and traces 44 of FIG. 1A, the pattern of signals at the edge connector 46 in FIG. 1B is identical to the pattern of signals in FIG. 1A. However, the conductive traces 44 on the rear face exit the carrier 41 to the right side of the second package 45 (as viewed from the rear face), rather than the left.

Because the packages 40, 45 and traces 44 of FIGS. 1A and 1B are on opposite sides of a single carrier, both sets of traces 44 connect the signal terminals A-G, T-Z to the same edge connector 46. Therefore, signals arriving at the edge 46 arrive simultaneously at both packages 40, 45. The packages 40, 45 can therefore share common signal buses, such as data and address buses, with the single edge connector 46. Mirroring the pattern of signal terminals A-G, T-Z on the second package 45 allows the second package 45 to share common signal lines with the first package 40 with a simple mirroring of the pattern of traces 44. The traces 44 can be mirrored easily with common photolithographic techniques by inverting an image on a photolithographic mask.

Previously, reversing connection of the signal terminals A-G, T-Z to the integrated circuit 42 would entail producing two sets of integrated circuit packages 40, 45, one for each side of the two-sided carrier 41. Rather than producing two types of mirror-imaged integrated circuit packages 40, 45, the present invention employs internal switching of signal connections between the integrated circuit 42 and the signal terminals A-G, T-Z within a single type of package 40.

Figure 2:
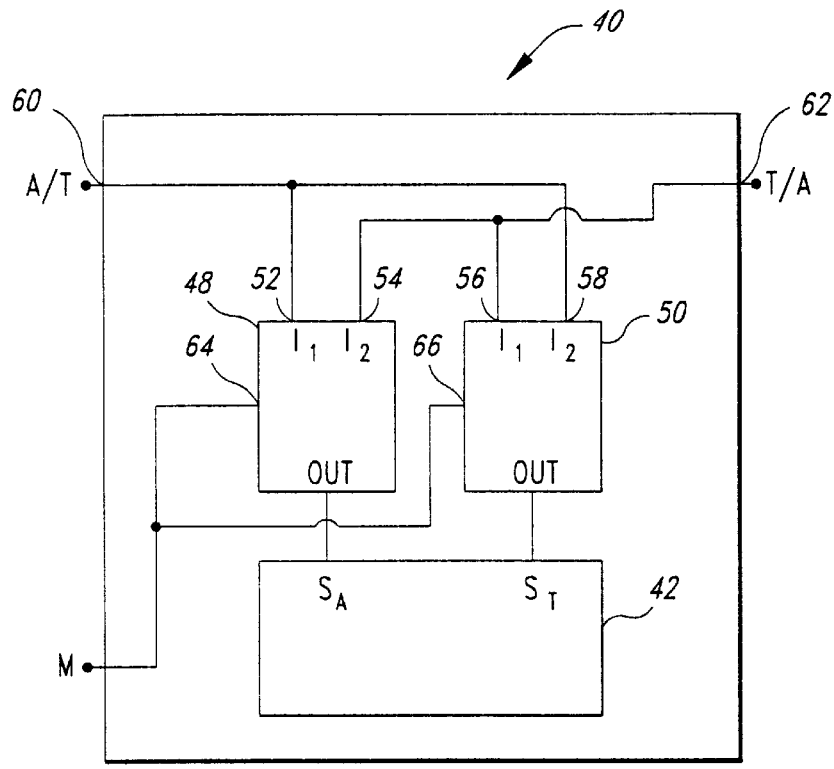
FIG. 2 is a block diagram of the integrated circuit package of FIGS. 1A and 1B showing an integrated device coupled to respective signal terminals through a pair of multiplexers.

FIG. 2 shows the switching structure for switching two of the signal terminals A, T. While the description of switching the terminal patterns of the integrated package 40 presents only two terminals A, T for clarity of presentation, it will be understood that the following discussion applies equally to each of the other signal terminals B-G, U-Z, and that the package 40 contains corresponding switching circuitry for each pair of signal terminals B-G, U-Z.

Within the package 40, the integrated device 42 produces two output signals $S_A$, $S_T$, each of which is coupled from a respective signal port 47, 49 to a corresponding multiplexer 48, 50. Each of the multiplexers 48, 50 has two I/O ports 52, 54, 56, 58 that are cross-coupled between respective I/O terminals 60, 62. For example, the first I/O port 52 on the left multiplexer 48 and the second I/O port 58 on the right multiplexer 50 are commonly connected to the left I/O terminal 60. The second I/O port 54 on the left multiplexer 48 and the first I/O port 56 on the right multiplexer 50 are commonly connected to the right I/O terminal 62.

The multiplexers 48, 50 selectively couple one or the other of the first and second I/O ports 52, 54, 56, 58 to the respective signals $S_A$, $S_T$ in response to the control signal M at a respective control port 64, 66. For example, the left multiplexer 48 couples the signal SA from the integrated device 42 through the first I/O port 52 to the left I/O terminal 60 in response to a high control signal M. At the same time, in response to the high control signal M, the right multiplexer 50 couples the signal $S_T$ from the integrated device 42, through the first I/O port 56 to the right I/O terminal 62. Thus, in response to a high control signal M, the left and right I/O terminals 60, 62 of the package 40, provide the signals SA and ST, respectively, and the left and right I/O terminals correspond to the signal terminals A, T. Thus, the package 40 is coupled according to the terminal pattern of FIG. 1A when the control signal M is high.

If, on the other hand, the control signal M is low, the left multiplexer 48 couples the signal SA from the integrated device 42, through the I/O port 54 to the right I/O terminal 62. At the same time, the right multiplexer 50 couples the signal ST from the integrated device 42, through the second I/O port 58 to the left I/O terminal 60. Accordingly, the I/O terminals 60, 62 correspond to the terminal pattern of FIG. 1B when the control signal M is low.

The signals $S_A$, $S_T$ are reversed in response to the changing states of the control signal M. Consequently, the user can select the pattern of signal terminals by providing the appropriate control signal M to the multiplexers 48, 50.

The above discussion assumes that the multiplexers 48, 50 couple output signals $S_A$, $S_T$ from the integrated device 42 to the I/O terminals 60, 62. Using the same block diagram, it can be seen that the multiplexers 48, 50 can also be used to couple input signals from the I/O terminals 60, 62 to the signal ports 47, 49. Of course, one skilled in the art will recognize that the structure of the multiplexers 48, 50 is modified for such applications. For example, in response to the high control signal M, the left multiplexer 48 couples input signals from the left I/O terminal 60, through the left I/O port 52 to the left signal terminal 47. At the same time, the right multiplexer 50 couples input signals from the right I/O terminal 62, through the left I/O port 56 to the right signal port 49. In response to the low control signal M, the multiplexers 48, 50 switch such that the input signals from left I/O terminal 60 reach the right signal port 49 and input signals on the right I/O terminal 62 reach the left signal port 42.

Figure 3:
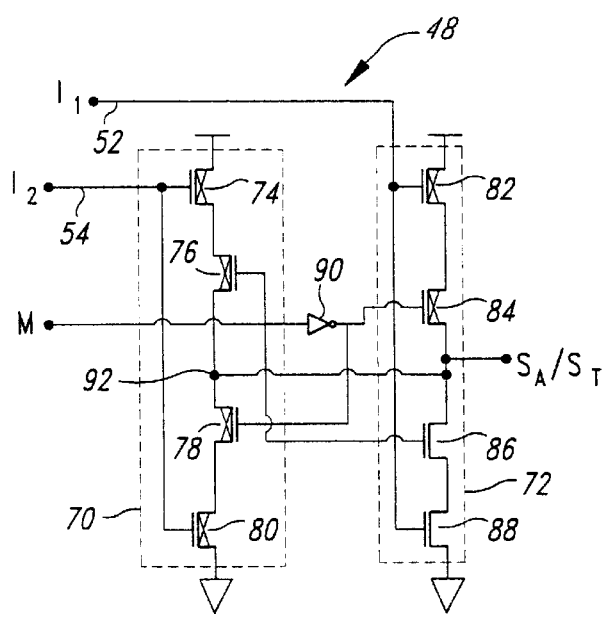
FIG. 3 is a schematic of a conventional multiplexer within the integrated circuit package of FIG. 2.

FIG. 3 shows a conventional circuit well suited for use as one of the multiplexers 48, 50 for coupling input signals from the I/O terminals 60, 62 to the signal ports 47, 49. Only one of the multiplexers 48 will be described herein for clarity, although one skilled in the art will recognize that the package 40 will typically include several such multiplexers. Moreover, although the multiplexer 48 is described by way of an exemplary embodiment, it will be understood that the package 40 can employ any suitable switching structure.

As shown in FIG. 3, the multiplexer 48 includes two legs 70, 72 extending between the supply voltage and ground. Each of the legs 70, 72 is formed from four MOS transistors 74, 76, 78, 80, 82, 84, 86, 88 serially coupled between the supply voltage and ground. In each of the legs 70, 72, the upper two transistors 74, 76, 82, 84 are PMOS transistors and the lower two transistors 78, 80, 86, 88 are NMOS transistors. The uppermost and lowermost transistors 74, 80 in the left leg 70 are controlled by signals from the second I/O port 54. The uppermost and lowermost transistors 82, 88 in the right leg 72 are controlled by signals from the first I/O port 52.

The legs 70, 72 are selectively enabled and disabled by the control signal M such that only one of the legs 70, 72 is active at any time. For example, a high control signal M turns OFF the lower PMOS transistor 76 in the left leg 70 and turns ON the upper NMOS transistor 86 in the right leg. At the same time, an inverter 90, in response to the control signal M, turns ON the lower PMOS transistor 84 in the right leg 72 and turns OFF the upper NMOS transistor 78 in the left leg 70. Because the left leg's lower PMOS transistor 76 and upper NMOS transistor 78 are OFF, they isolate a node 92 in the left leg 70 so that the left leg 70 does not affect signals SA, ST, output from multiplexer 48.

At the same time, the lower PMOS transistor 84 and upper NMOS transistor 86 in the right leg 72 are ON, allowing signals at the first I/O port 52 to control the output signals SA, ST through the upper PMOS transistor 82 and lower NMOS transistor 88. For example, if the input I, at the first I/O port 52 is high, the lower NMOS transistor 88 in the right leg 72 turns ON and couples the node 92 to ground while the upper PMOS transistor 82 turns OFF to isolate the node 92 from the supply voltage. This pulls the node 92 low. Thus, if the signal at the first I/O port 52 is high, the output signal to the integrated device 42 (FIG. 2) is low.

Similarly, if the signal at the first I/O port 52 is low, the upper PMOS transistor 82 turns ON, coupling the supply voltage to the node 92. At the same time, the lower NMOS transistor 88 turns OFF, isolating the node 92 from ground. This pulls the node 92 high. Thus, in response to a low signal at the first I/O port 52, the output signal from the node 92 is high.

Operation of the left leg 70 is identical to operation of the right leg 72, except that, as discussed above, the left leg 70 is active only when the control signal M is low.

Figure 4:
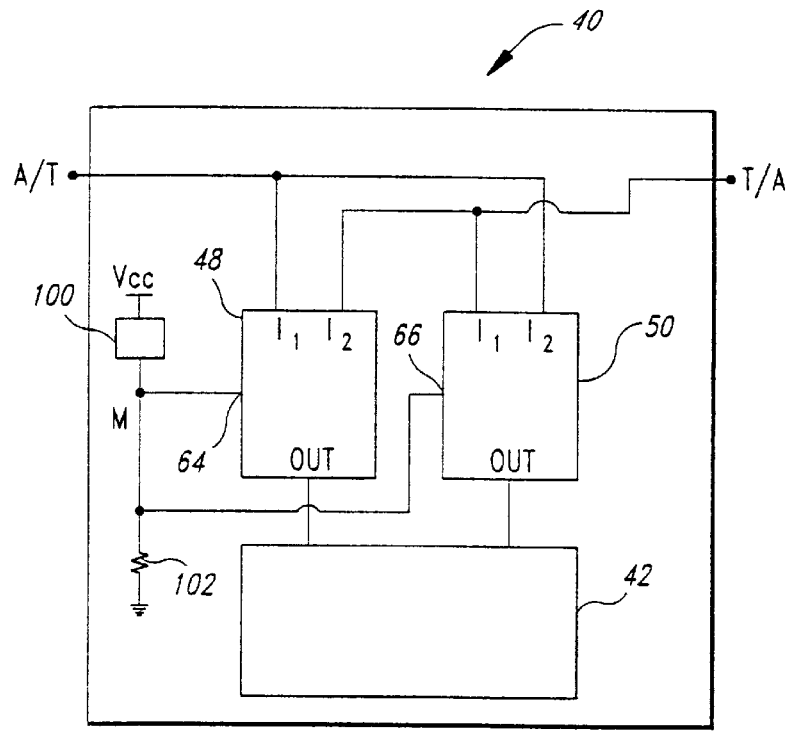
FIG. 4 is a block diagram of an alternative structure of the integrated circuit package of FIGS. 1A and 1B having an internally produced control signal.

FIG. 4 shows an alternative embodiment of the first package 40 where the control signal M is produced internally. Within the package 40, a switch 100 is coupled between a supply voltage Vcc and the control ports 64, 66. The switch 100 can be any appropriate type of device that selectively couples the control ports 64, 66 to the supply voltage $V_{cc}$ or isolates the control ports 64, 66 from the supply voltage Vcc. For example, the switch 100 may be a fuse, antifuse, or non-volatile programmable cell, such as a FLASH cell. Additionally, a bleed impedance 102 is coupled between the control ports 64, 66 and ground to provide a high resistance path to reference the control ports 64, 66 to ground. While the bleed impedance 102 is represented for clarity by a resistor symbol, the bleed impedance 102 is typically realized by a long channel transistor for ease of fabrication.

In operation, a user selects the terminal pattern by setting the switch 100. First, the user determines whether the package 40 is to have the terminal pattern of FIG. 1A or FIG. 1B and then programs the switch 100 accordingly. For example, if the user selects the terminal pattern of FIG. 1A, the user sets the switch 100 in a conducting state to supply the supply voltage $V_{cc}$ to the control ports 64, 66. As discussed above with respect to FIG. 3, the multiplexers 48, 50 respond to the high control signal M by connecting the signal terminals A, T in a pattern corresponding to the terminal pattern of FIG. 1A. If, on the other hand, the user selects the terminal pattern of FIG. 1B, the user sets the switch 100 to the open state, isolating the control ports 64, 66 from the supply voltage $V_{cc}$. Because the control ports 64, 66 are coupled to ground through the bleed impedance 102, the control signal M is low and the signal terminals A, T correspond to the terminal pattern of FIG. 1B, as described above.

The method for programming the switch 100 will depend upon the type of switch incorporated in the package 40. If the switch 100 is a fuse, the switch 100 is set to the open state by laser cutting the fuse conductor. To set the switch 100 to the closed state, the fuse is left intact.

If the switch 100 is an antifuse, the switch 100 is set to the closed state by applying a high voltage across the antifuse. The high voltage "blows" the antifuse to produce a conductive path through the antifuse. The antifuse then couples the supply voltage $V_{cc}$ to the control ports 64, 66. If left unblown, the antifuse is an open circuit. Consequently, to set the switch 100 to the open state, the antifuse is left intact.

If the switch 100 is a programmable, non-volatile cell, the switch 100 can be programmed according to standard programming techniques. For example, if the switch is a FLASH cell, it is programmed by applying appropriate erase voltages and programming voltages.

Figure 5:
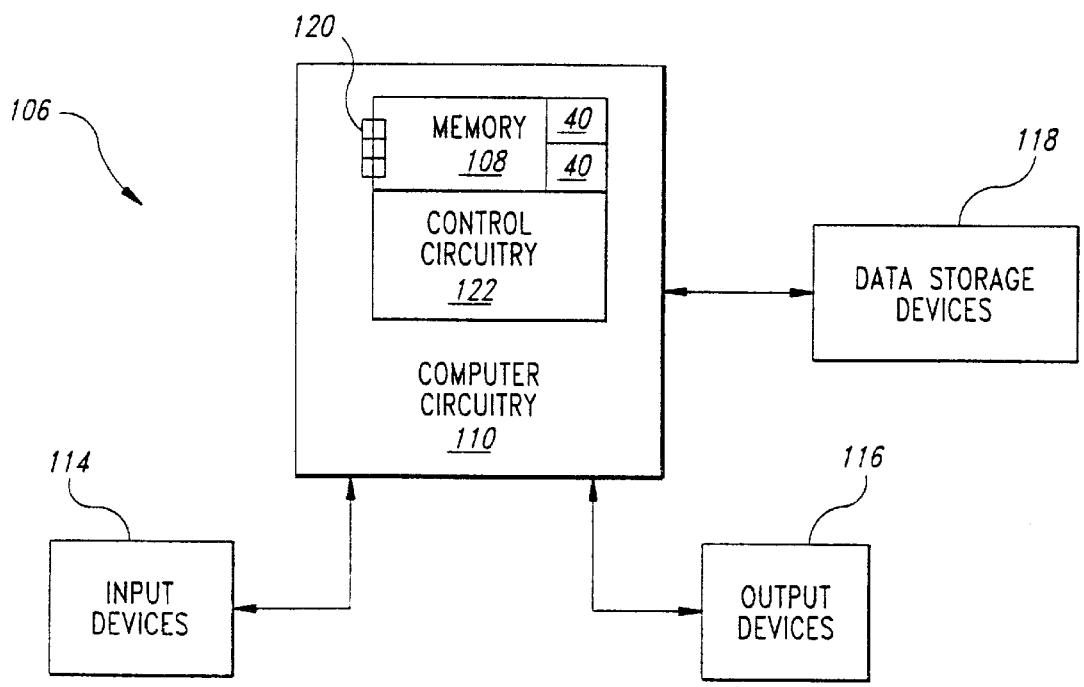
FIG. 5 is a block diagram of a computer containing a two-sided memory module according to the invention.

FIG. 5 is a block diagram of a computer system 106 employing a memory module 108 that contains two packages 40. The computer system 106 includes computer circuitry 110 for performing computer functions, such as executing software to perform desired calculations and tasks. The circuitry 110 typically contains a processor (not shown) and the memory module 108 as shown.

One or more input devices 114, such as a keypad or a mouse, are coupled to the computer circuitry 110 and allow an operator to manually input data thereto. One or more output devices 116 are coupled to the computer circuitry 110 to display or otherwise output data generated by the computer circuitry 110. Examples of output devices include a printer and a video display unit. One or more data storage devices 118 are coupled to the computer circuitry to store data on or retrieve data from external storage media (not shown). Examples of storage devices 118 and storage media include drives that accept hard and floppy disks, tape cassettes, and compact-disk read only memories. The computer circuitry 110 also includes signal, address and data buses 120 and control circuitry 122 that provide the signals described above for input to or output from the packages 40.

While the present invention has been presented by way of exemplary embodiments, various modifications may be made without deviating from the spirit and scope of the invention. For example, the terminal patterns of FIGS. 1A and 1B are presented as mirror images. However, one skilled in the art will recognize that by appropriate coupling of the multiplexers 48, 50, a variety of patterns may be selected which are not necessarily mirror images. Also, while switching of signal connections between the integrated circuit 42 and the signal terminals A-G, T-Z has been described using conventional multiplexers, many other appropriate conventional circuits, such as conventional switching circuits, can be employed without departing from the scope of the invention. Thus, while a particular embodiment has been described to illustrate the operation of the invention, many equivalent devices could be designed which operate in the same way to provide the same result and fall within the scope of the invention.

We claim:

1. An integrated circuit package, comprising:

a plurality of I/O terminals:

an integrated circuit having a plurality of signal lines, and a switching circuit coupled between the integrated circuit and the I/O terminals, the switching circuit having a plurality of signal ports and a control input, each signal port being coupled to a respective signal line, the switching circuit further having a plurality of I/O ports, each I/O port being connected to a respective I/O terminal, the switching circuit being responsive to couple the signal lines to the I/O ports according to a first coupling pattern in response to a first control signal at the control input, the switching circuit being responsive to couple the signal lines to the I/O ports according to a second coupling pattern different from the first coupling pattern in response to a second control signal at the control input, wherein a pair of the I/O terminals are positioned at symmetrically opposite positions on the package and wherein the switching circuit includes a pair of linked circuits cross coupled between the pair of I/O terminals, a first of the linked circuits coupling a first of the I/O terminals in the opposed pair to a first signal line in response to the first control signal at the control input, the first linked circuit coupling a second of the I/O terminals in the opposed pair to the first signal line in response to the second control signal at the control input.

2. The integrated circuit package of claim 1 wherein a second of the linked circuits couples the second of the I/O terminals in the opposed pair to the second signal line in response to the first control signal at the control input, the second linked circuit coupling the first of the I/O terminals in the opposed pair to the second signal line in response to the second control signal at the control input.

3. An integrated circuit package, comprising:

a plurality of I/O terminals, an integrated circuit having a plurality of signal lines, and a switching circuit coupled between the integrated circuit and the I/O terminals, the switching circuit having a plurality of signal ports and a control input, each signal port being coupled to a respective signal line, the switching circuit further having a plurality of I/O ports, each I/O port being connected to a respective I/O terminal, the switching circuit being responsive to couple the signal lines to the I/O ports according to a first coupling pattern in response to a first control signal at the control input, the switching circuit being responsive to couple the signal lines to the I/O ports according to a second coupling pattern different from the first coupling pattern in response to a second control signal at the control input, wherein a pair of the I/O terminals are positioned at symmetrically opposite positions on the device and wherein the switching circuit includes a pair of linked circuits cross coupled between the pair of I/O terminals, a first of the linked circuits coupling a first of the I/O terminals in the opposed pair to a first signal line in response to the first control signal at the control input, the first linked circuit coupling the first I/O terminals in the opposed pair to the second signal line in response to the second control signal at the control input.

4. The integrated circuit package of claim 3 wherein a second of the linked circuits couples the second of the I/O terminals in the opposed pair to the second signal line in response to the first control signal at the control input, the second linked circuit coupling the second of the I/O terminals in the opposed pair to the first signal line in response to the second control signal at the control input.

5. The integrated circuit package of claim 1, further including a programmable control signal source integrated into the package.

6. The integrated circuit package of claim 5 wherein the control signal source includes an externally programmable switch, the control signal source being responsive to produce the first control signal in response to the switch being programmed to an open state and to produce the second control signal in response to the switch being programmed to the closed state.

7. The integrated circuit package of claim 1, further including an externally accessible mode terminal coupled to the control signal for receiving the control signal.

8. A two-sided integrated circuit module, comprising:

a two-sided carrier;

A first integrated circuit package of a first type on a first side of the carrier, the first integrated circuit package having a programmable signal terminal pattern programmed to a first selected pattern; and a second integrated circuit package of the first type in a second side of the carrier, the second integrated circuit package having a programmable signal terminal pattern programmed to a second selected pattern that is a mirror image of the first selected pattern.

9. The two-sided module of claim 8 wherein the integrated circuit packages include control inputs and wherein the control input of the first package is coupled to a control signal of a first state and the control input of the second package is coupled to a control signal of a second state different from the first state.

10. The two-sided module of claim 8, further including a programmable control signal source integrated into the packages.

11. The two-sided memory module of claim 10 wherein the control signal sources include an externally programmable switch, the control signal sources being responsive to produce the first control signal in response to the switch being programmed to an open state and to produce the second control signal in response to the switch being programmed to the closed state.

12. The two-sided module of claim 9 wherein the packages further include an externally accessible mode terminal coupled to the control signal for receiving the control signal.

13. A computer system comprising:

an input device;

an output device;

computer circuitry coupled to the input and output devices, the computer circuitry including a plurality of integrated packages, each integrated package including:

a plurality of I/O terminals;

an integrated circuit having a plurality of signal lines; and a switching circuit coupled between the integrated circuit and the I/O terminals, the switching circuit having a plurality of signal ports and a control input, each signal port being coupled to a respective signal line, the switching circuit further having a plurality of I/O ports, each I/O port being connected to a respective I/O terminal, the switching circuit being responsive to couple the signal lines to the I/O ports according to a first coupling pattern in response to a first control signal at the control input, the switching circuit being responsive to couple the signal lines to the I/O ports according to a second coupling pattern different from the first coupling pattern in response to a second control signal at the control input, wherein a pair of the I/O terminals are positioned at symmetrically opposite positions on the package wherein the switching circuit includes a pair of linked circuits cross coupled between the pair of I/O terminals, a first of the linked circuits coupling a first of the I/O terminals in the opposed pair to a first signal line in response to the first control signal at the control input, the first linked circuit coupling a second of the I/O terminals in the opposed pair to the first signal line in response to the second control signal at the control input; and a signal bus coupled to the integrated packages.

14. The computer system of claim 13 wherein a second of the linked circuits couples the second of the I/O terminals in the opposed pair to the second signal line in response to the first control signal at the control input, the second linked circuit coupling the first of the I/O terminals in the opposed pair to the second signal line in response to the second control signal at the control input.

15. The computer system of claim 13 wherein a pair of the I/O terminals are positioned at symmetrically opposite positions on the device wherein the switching circuit includes a pair of linked circuits cross coupled between the pair of I/O terminals, a first of the linked circuits coupling a first of the I/O terminals in the opposed pair to a first signal line in response to the first control signal at the control input, the first linked circuit coupling the first I/O terminals in the opposed pair to the second signal line in response to the second control signal at the control input.

16. A method of coupling to a plurality of integrated circuit packages from a common bus, the packages being mounted at respective mounting locations, comprising the steps of:

selecting a pattern of traces for connection between the bus and a first mounting location;

selecting a pattern of traces for connection between the bus and a second mounting location;

programming a first integrated circuit package to produce a first signal terminal pattern in response to the selected pattern of traces of the first mounting location; and programming a second integrated circuit package to produce a second signal terminal pattern that is a mirror image of the first signal terminal pattern in response to the selected pattern of traces of the second mounting location.

17. The method of claim 16 wherein the step of programming the first integrated circuit package includes the step of providing a first control signal to a control input of the first integrated circuit package.

18. The method of claim 17 wherein the step of programming the second integrated circuit package includes the step of providing a second control signal different from the first control signal to a control input of the second integrated circuit package.

19. The method of claim 16 wherein the first integrated circuit includes a non-volatile mode control switch and wherein the step of programming the first integrated circuit package includes the step of setting the switch to a selected state.

* * * * *

UNITED STATES PATENT AND TRADEMARK OFFICE
CERTIFICATE OF CORRECTION

PATENT NO. : 5,808,897
DATED : September 15, 1998
INVENTOR(S) : Miller, Jr. et al.

It is certified that error appears in the above-identified patent and that said Letters Patent is hereby corrected as shown below:

| Column | Reads | Should Read |
|---|---|---|
| Column 4, line 23 | "SA" | -- $S_T$ -- |
| Column 4, line 31 | "SA and ST" | -- $S_A$ and $S_T$ -- |
| Column 4, line 36 | "SA" | -- $S_A$ -- |
| Column 4, line 39 | "ST" | -- $S_T$ -- |
| Column 5, line 30 | "SA, ST" | -- $S_A$ and $S_T$ -- |
| Column 5, line 34 | "SA, ST" | -- $S_A$, $S_T$ -- |
| Column 5, line 35 | "I," | -- $I_1$ -- |

Signed and Sealed this

Twenty-ninth Day of May, 2001

*Attest:*

NICHOLAS P. GODICI

*Attesting Officer*      *Acting Director of the United States Patent and Trademark Office*